(12) United States Patent
Fang et al.

(10) Patent No.: US 6,979,619 B1
(45) Date of Patent: Dec. 27, 2005

(54) FLASH MEMORY DEVICE AND A METHOD OF FABRICATION THEREOF

(75) Inventors: Hao Fang, Cupertino, CA (US);
Yue-Song He, San Jose, CA (US);
Mark S. Chang, Los Altos, CA (US);
Kent K. Chang, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 701 days.

(21) Appl. No.: 09/941,370

(22) Filed: Aug. 28, 2001

Related U.S. Application Data

(62) Division of application No. 09/595,422, filed on Jun. 15, 2000, now abandoned.

(51) Int. Cl.[7] .......................................... H01L 21/8247
(52) U.S. Cl. ..................................... 438/258; 438/264
(58) Field of Search ................................ 438/257–267

(56) References Cited

U.S. PATENT DOCUMENTS

| | | | |
|---|---|---|---|
| 4,780,424 A * | 10/1988 | Holler et al. ............... | 438/262 |
| 5,175,120 A * | 12/1992 | Lee ............................ | 438/201 |
| 5,254,489 A * | 10/1993 | Nakata ............... | 148/DIG. 112 |
| 5,449,629 A * | 9/1995 | Kajita ................. | 257/E29.162 |
| 5,637,520 A * | 6/1997 | Cappelletti et al. ......... | 438/258 |
| 5,674,788 A * | 10/1997 | Wristers et al. ............. | 438/301 |
| 6,110,782 A * | 8/2000 | Chu et al. ................... | 257/501 |
| 6,380,033 B1 * | 4/2002 | He et al. ..................... | 438/258 |
| 6,417,051 B1 * | 7/2002 | Takebuchi .................. | 438/287 |
| 6,436,759 B1 * | 8/2002 | Chien et al. ................ | 438/241 |
| 2001/0016407 A1 * | 8/2001 | Schoenfeld et al. ........ | 438/618 |

* cited by examiner

*Primary Examiner*—Richard A. Booth
(74) *Attorney, Agent, or Firm*—Winstead Sechrest & Minick P.C.

(57) ABSTRACT

In a first aspect of the present invention, a method of fabricating a flash memory device is disclosed. The method comprises the steps of providing a portion of a dual gate oxide in a periphery area of the memory device and then simultaneously providing a dual gate oxide in a core area of the memory device and completing the dual gate oxide in the periphery area. Finally, a nitridation process is provided in both the core and periphery areas subsequent to the previous steps. In a second aspect of the present invention, a flash memory device is disclosed. The flash memory device comprises core area having a plurality of memory transistors comprising an oxide layer, a first poly layer, an interpoly dielectric layer, and a second poly layer. The flash memory device further comprises a periphery area having a plurality of transistors comprising an oxide layer, a portion of the first poly layer, and the second poly layer. According to the present invention, the method for fabricating the flash memory device is a simplified process that results in a significant improvement in the oxide reliability in the core and periphery areas and also eliminates the nitrogen contamination problem in the periphery area.

4 Claims, 4 Drawing Sheets

FLASH MEMORY DEVICE AND A METHOD OF FABRICATION THEREOF

CROSS REFERENCE TO RELATED APPLICATION

This Application is a divisional application of U.S. patent application Ser. No. 09/595,422, filed Jun. 15, 2000.

FIELD OF THE INVENTION

The present invention relates to flash memory devices, and more particularly to a method for fabricating a flash memory device.

BACKGROUND OF THE INVENTION

A flash memory device typically includes a core area and a periphery area. The core area includes memory transistors, while the periphery area contains both low-voltage transistors for handling logic and switching circuitry, and high-voltage transistors for handling high-voltages encountered during flash memory programming and erase operations.

FIG. 1 is a top view of a portion of a conventional NAND flash memory device 10 The flash memory device 10 includes a core area 12 and a periphery area 14. The core area 12 includes an array of memory transistors 16 and two select gate regions that include a row of select transistors connected by a select word-line 28. One select gate region is referred to as a select drain gate region 18 and the other select gate region is referred to as a select source gate region 20. Although not shown, the periphery area 14 contains low-voltage transistors for handling logic and switching circuitry, and high-voltage transistors for handling high-voltages encountered during flash memory programming and erase operations.

The memory transistors 16 are stacked gate structures that include a layer of type-1 polysilicon (poly1) 22 that form floating gates, and a layer of type-2 polysilicon (poly2) that forms word-lines 26 interconnecting a row of memory transistors 16. The select transistors in the select gate regions 18 and 20 are single gate structures comprising a layer of poly1 22, which also forms the select word-line 28 connecting the select gate transistors. Fabricating such an device is a multi-step process.

FIG. 2 is a flow chart illustrating conventional process steps required to fabricate a flash memory device 10. Also shown is a series of cross sectional views (FIGS. 2(a–g)) of a substrate showing the resulting structure.

First a dual core gate oxide is performed, via step 40. Typically a dual core gate oxide is implemented to fabricate oxide layers of different thickness in the core area. Next, a nitridation process is performed, via step 42. This is done to improve the reliability of the core gate oxide. Typically, the nitridation process involves the introduction of nitrogen to the Si-SiO$_2$ interface in the core and periphery areas. Next, a layer of type-1 polysilicon (poly1) is deposited in both the core area and periphery area, via step 44. After the poly1 is patterned, a layer of oxide nitride oxide (ONO) is deposited over the poly1 layer, via step 46.

After the layer of ONO is deposited, the core area is covered by photo resist and the ONO and poly1 layer is removed in the periphery area, via step 48. Then, a dual periphery gate oxide is performed, via step 50. Finally, a type-2 layer of polysilicon (poly2) is deposited in all areas and the gate stacks are formed, via step 52.

As previously mentioned, a nitridation process is performed after the dual core gate oxide in order to improve the reliability of the core gate oxide. However, when the nitridation process is performed, nitrogen is also introduced in the periphery area. Because the presence of nitrogen residue in the periphery area inhibits the subsequent growth of oxide in the periphery area, the quality of the dual periphery gate oxide is problematic based on the existence of defects related to the nitrogen residue.

Consequently, the nitrogen contamination problem is a technically difficult issue that hinders the implementation of nitridation in the flash memory fabrication process. Therefore, the reliability of the core gate oxide and thus the reliability of the flash memory device, becomes more of a concern. Several techniques, such as reoxidation treatment after nitridation or using a hard mask to cover the periphery area during nitridation have been used. However, these methods complicate the process and introduce some side effects as well.

Accordingly, an improved method of fabricating a flash memory device is needed. The method should be cost effective, easy to implement and shouldn't add undue complexity to existing fabrication methods. The present invention addresses such a need.

SUMMARY OF THE INVENTION

In a first aspect of the present invention, a method of fabricating a flash memory device is disclosed. The method comprises the steps of providing a portion of a dual gate oxide in a periphery area of the memory device and then simultaneously providing a dual gate oxide in a core area of the memory device and completing the dual gate oxide in the periphery area. Finally, a nitridation process is provided in both the core and periphery areas subsequent to the previous steps.

In a second aspect of the present invention, a flash memory device is disclosed. The flash memory device comprises a core area having a plurality of memory transistors comprising an oxide layer, a first poly layer, an interpoly dielectric layer, and a second poly layer. The flash memory device further comprises a periphery area having a plurality of transistors comprising an oxide layer, a portion of the first poly layer, and the second poly layer.

According to the present invention, the use of the method for fabricating the flash memory device results in a significant improvement in the oxide reliability in the core and periphery areas and also eliminates the nitrogen contamination problem in the periphery area.

DETAILED DESCRIPTION OF THE INVENTION

The present invention relates to an improvement in the fabrication of flash memory devices. The following description is presented to enable one of ordinary skill in the art to make and use the invention and is provided in the context of a patent application and its requirements. Various modifications to the preferred embodiment will be readily apparent to those skilled in the art and the generic principles herein may be grown to other embodiments. Thus, the present invention is not intended to be limited to the embodiment shown but is to be accorded the widest scope consistent with the principles and features described herein.

A preferred embodiment of the present invention provides a NAND flash memory device and a method for fabricating the same. Utilizing a method in accordance with the present invention, the dual periphery gate oxide is provided first and the nitridation process is provided subsequent to providing the dual periphery gate oxide. By providing the nitridation process subsequent to providing the dual periphery gate oxide, the dual periphery gate oxide can be provided in a less difficult fashion since it is easier to grow oxide when there is no nitrogen present. Furthermore, as a result of providing the nitridation process subsequent to providing the dual periphery gate oxide, the reliability of the flash memory is improved.

Figure 1:
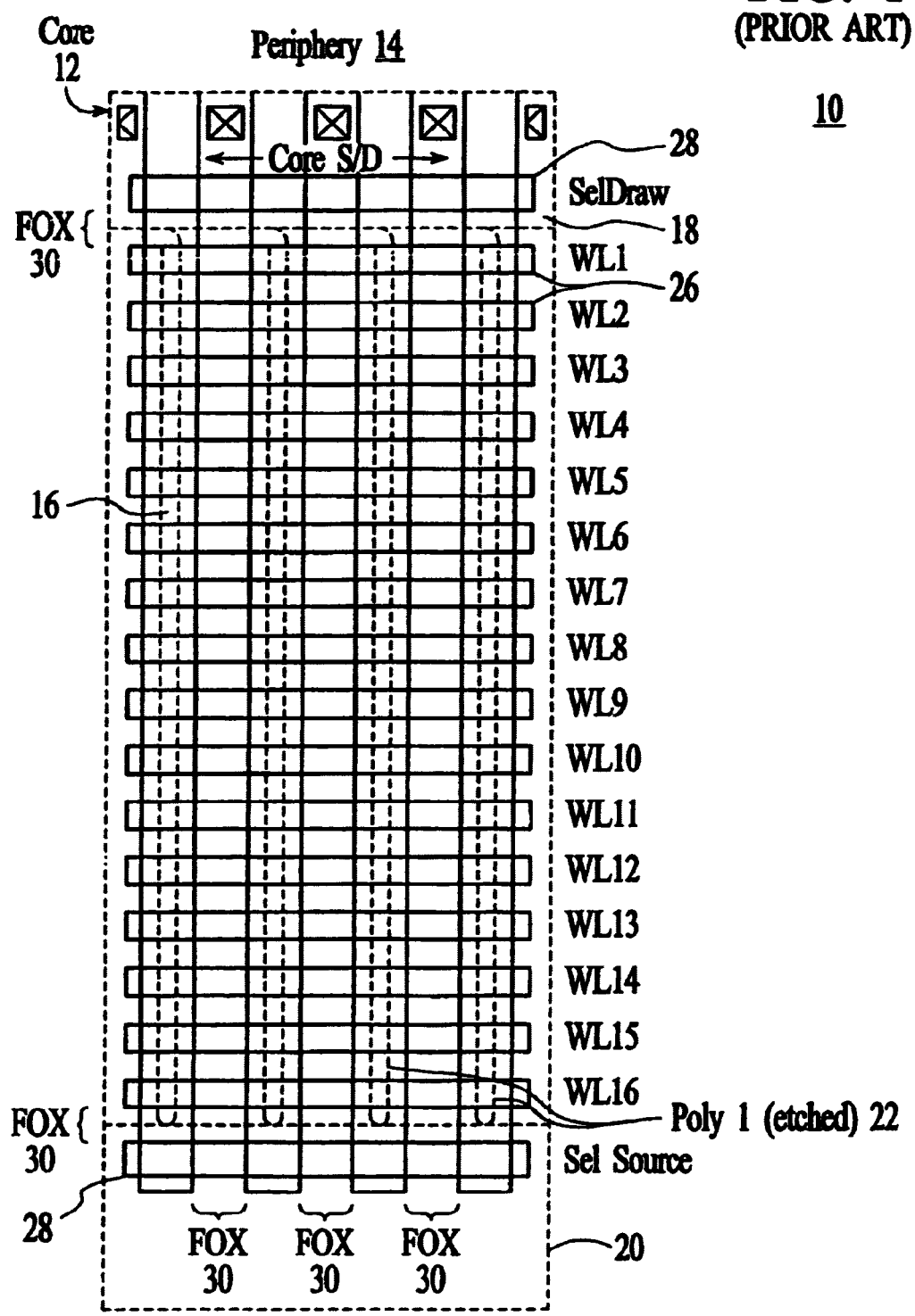
FIG. 1 is a top view of a portion of a conventional NAND flash memory device.
Figure 2:
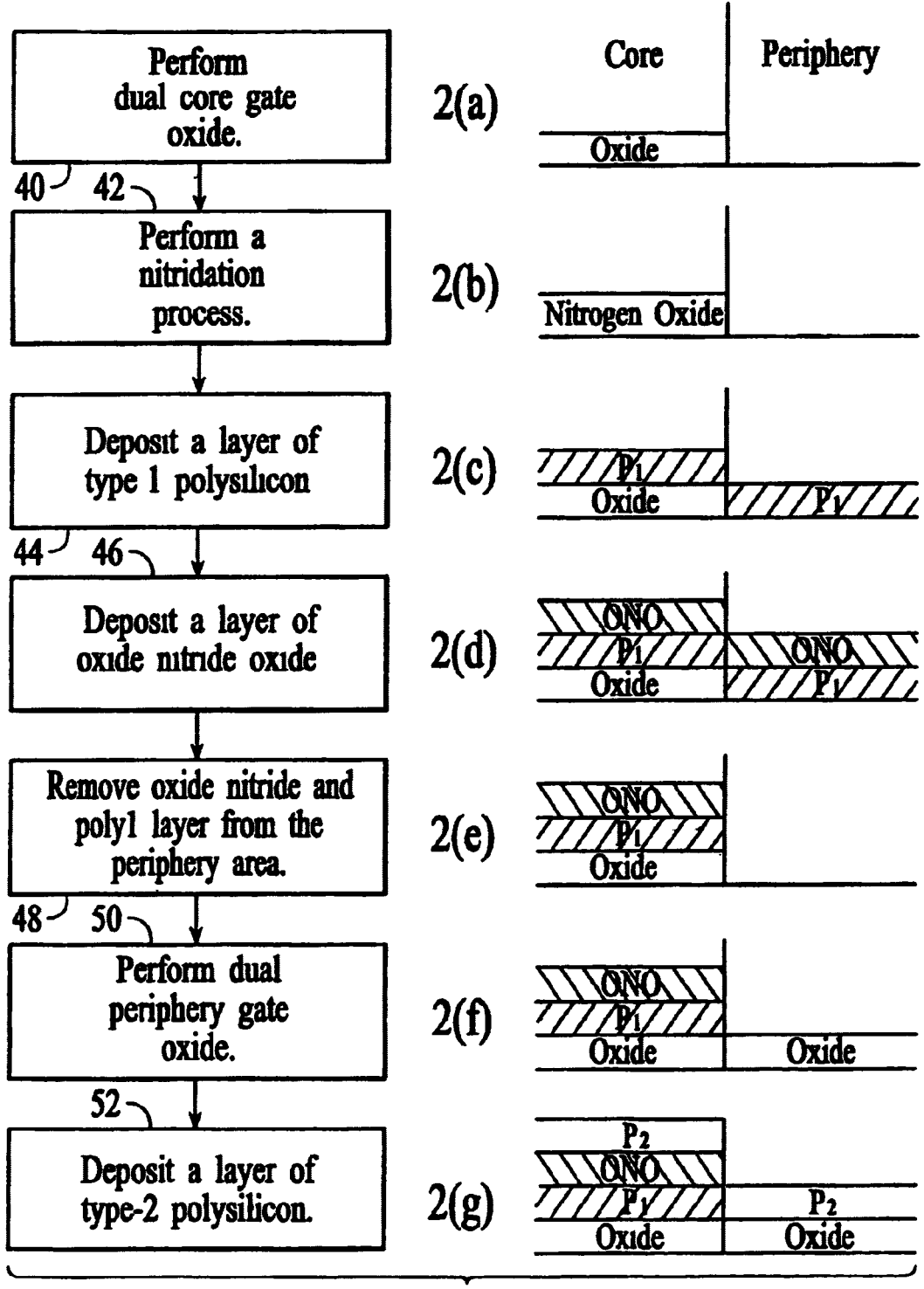
FIG. 2 is a flow chart illustrating conventional process steps required to fabricate a conventional flash memory device as well as a series of cross sectional views of a substrate showing the resulting structure.
Figure 3:
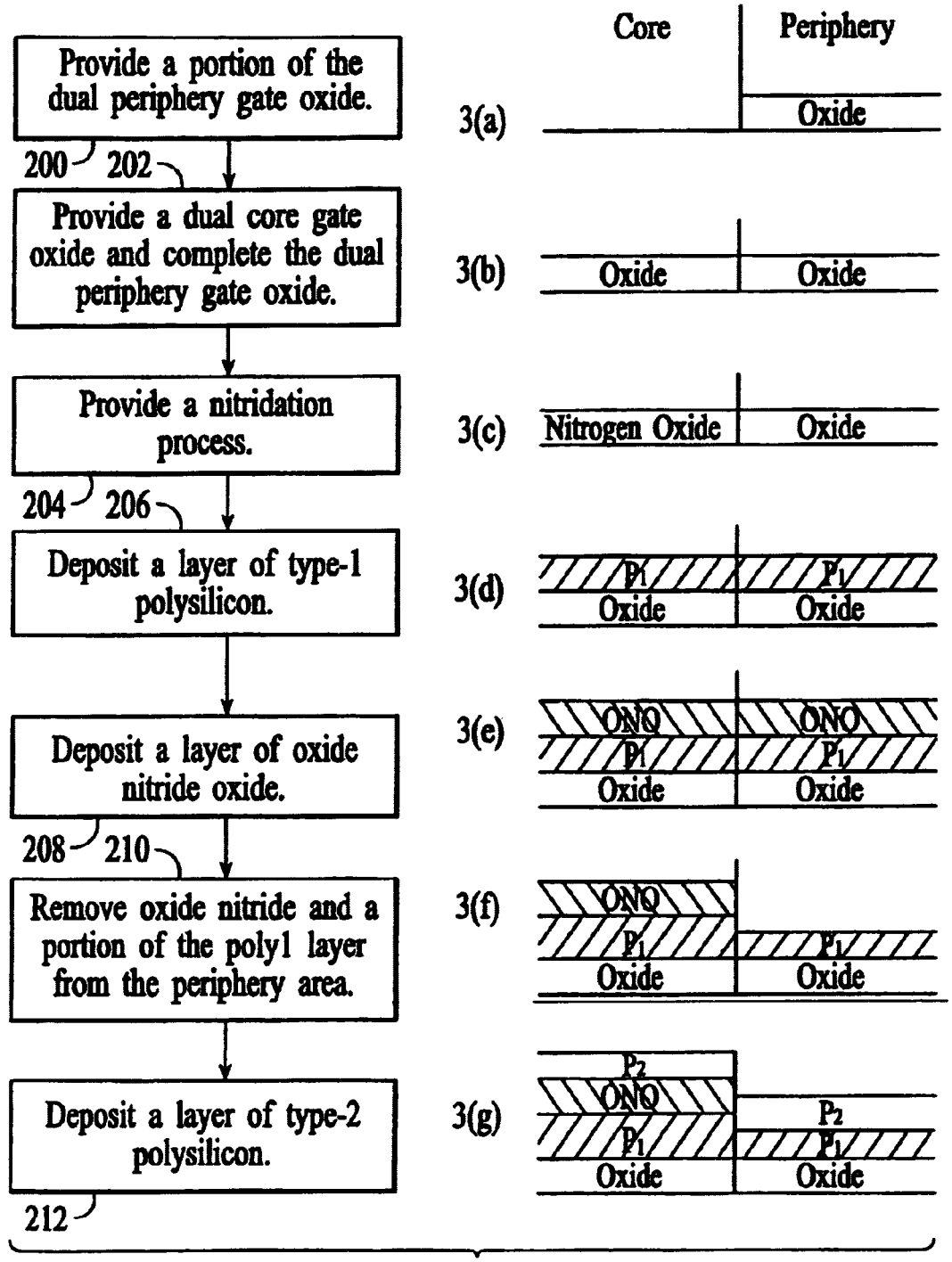
FIG. 3 is a flow chart illustrating the processing steps for fabricating a NAND flash memory device according to a preferred embodiment of the present invention as well as a series of cross sectional views of the resulting structure at the corresponding process steps.

FIG. 3 is a flow chart illustrating the processing steps for fabricating a NAND flash memory device according to a preferred embodiment. Also shown is a series of cross sectional views (FIGS. 3(a–g)) of a substrate showing the resulting structure.

The process begins by providing a portion of a dual periphery gate oxide, via step 200. Next, a dual core gate oxide is provided, along with the completion of the dual periphery gate oxide, via step 202. A nitridation process is then provided, via step 204.

By providing the nitridation process after forming the dual periphery gate oxide and the dual core gate oxide, the reliability of the flash memory device is significantly improved over flash memory devices formed by a conventional process.

Referring back to FIG. 3, next, a layer of type-1 polysilicon (poly1) is deposited in both the core area and periphery area, via step 206. After the poly1 is patterned, a layer of oxide nitride nitride (ONO) is deposited over the poly1 layer, via step 208. After the layer of ONO is deposited, the core area is covered by photo resist and the ONO layer, along with a portion of the poly1 layer is removed in the periphery area, via step 210.

In a preferred embodiment, approximately half of the poly1 layer is removed from the periphery area. Only a portion of the poly1 layer is removed because if the layer is completely removed, some of the periphery gate oxide could inadvertently be removed thereby destroying the uniformity of the periphery gate oxide. Finally, thereafter a type-2 layer of polysilicon (poly2) is deposited in all areas, via step 212.

Figure 4:
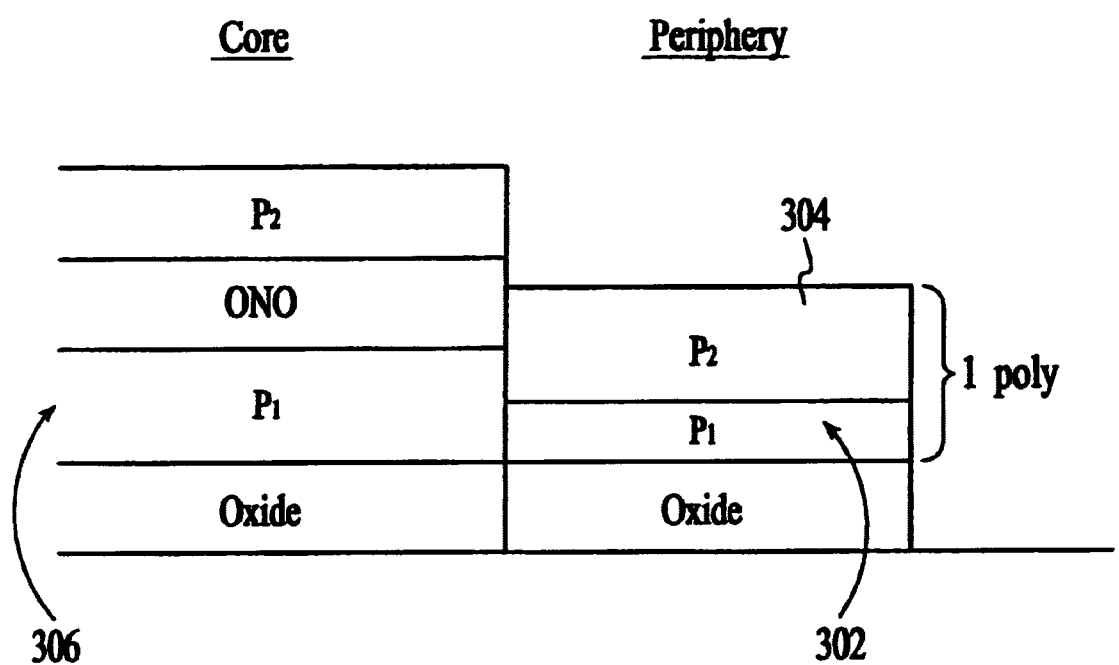
FIG. 4 is an exploded view of FIG. 3(g) illustrating a cross sectional view of a flash memory device in accordance with present invention.

FIG. 4 is an exploded view of FIG. 3(g) illustrating a cross sectional view of a flash memory device in accordance with present invention showing both the core and periphery areas. The periphery area comprises a periphery poly1 layer 302 directly underneath a poly2 layer 304 wherein the periphery poly1 layer 302 is approximately half the height of the core poly1 layer 306.

The method for fabricating the flash memory device as described herein results in a significant improvement in the reliability of the flash memory device, as well as the periphery transistors.

A flash memory device and a method of fabrication thereof has been disclosed. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for fabricating a memory device on a silicon substrate, the method comprising the steps of:
   (a) providing a portion of a dual gate oxide in a periphery area of the memory device;
   (b) simultaneously providing a dual gate oxide in a core area of the memory device and completing the dual gate oxide in the periphery area, wherein the dual gate oxide in the core area forms an interface between the oxide and the silicon substrate;
   (c) strengthening the interface by providing a nitrification process in both the core area and periphery area of the memory device subsequent to steps (a) and (b), thereby improving the reliability of the dual gate oxide in the core area;
   (d) depositing a layer of type-1 polysilicon in both the core area and periphery area of the memory device;
   (e) depositing a layer of oxide nitride oxide over the layer of type-1 polysilicon; and
   (f) removing the layer of oxide nitride oxide and a portion of the layer of type-1 polysilicon from the periphery area of the memory device, wherein step (f) further includes removing approximately half the layer of type-1 polysilicon from the periphery area of the memory device.

2. The method of claim 1 further comprising:
   (g) depositing a layer of type-2 polysilicon in both the core and periphery areas of the memory area.

3. A method for fabricating a memory device on a silicon substrate, the method comprising the steps of:
   (a) providing a portion of a dual gate oxide in a periphery area of the memory device;
   (b) simultaneously providing a dual gate oxide in a core area of the memory device and completing the dual gate oxide in the periphery area, wherein the dual gate oxide in the core area forms an interface between the oxide and the silicon substrate;
   (c) strengthening the interface by providing a nitrification process in both the core area and periphery area of the memory device subsequent to steps (a) and (b), thereby improving the reliability of the dual gate oxide in the core area;
   (d) depositing a layer of type-1 polysilicon in both the core area and periphery area of the memory device;
   (e) depositing a layer of oxide nitride oxide over the layer of type-1 polysilicon; and
   (f) removing the layer of oxide nitride oxide and a portion of the layer of type-1 polysilicon from the periphery area of the memory device.

4. A method for fabricating a memory device on a silicon substrate, the method comprising the steps of:
   (a) providing a portion of a dual gate oxide in a periphery area of the memory device;

(b) simultaneously providing a dual gate oxide in a core area of the memory device and completing the dual gate oxide in the periphery area, wherein the dual gate oxide in the core area forms an interface between the oxide and the silicon substrate; and (c) strengthening the interface by providing a nitrification process in both the core area and periphery area of the memory device subsequent to steps (a) and (b), thereby improving the reliability of the dual gate oxide in the core area;

(d) depositing a layer of type-1 polysilicon in both the core area and periphery area of the memory device;

(e) depositing a layer of oxide nitride oxide over the layer of type-1 polysilicon; and (f) removing the layer of oxide nitride oxide and a portion of the layer of type-1 polysilicon from the periphery area of the memory device.

* * * * *

UNITED STATES PATENT AND TRADEMARK OFFICE
CERTIFICATE OF CORRECTION

PATENT NO. : 6,979,619 B1
DATED : December 27, 2005
INVENTOR(S) : Hao Fang et al.

It is certified that error appears in the above-identified patent and that said Letters Patent is hereby corrected as shown below:

Column 5,
Line 5, remove "and" after ";".

Signed and Sealed this

Twenty-third Day of May, 2006

JON W. DUDAS
*Director of the United States Patent and Trademark Office*